(12) United States Patent
Shen et al.

(10) Patent No.: US 12,058,901 B2
(45) Date of Patent: Aug. 6, 2024

(54) DISPLAY DEVICE AND VEHICLE

(71) Applicant: WUHAN CHINA STAR OPTOELECTRONICS SEMICONDUCTOR DISPLAY TECHNOLOGY CO., LTD., Wuhan (CN)

(72) Inventors: Haiyan Shen, Wuhan (CN); Zhimeng Luo, Wuhan (CN); Le Zhang, Wuhan (CN); Wenxu Xianyu, Wuhan (CN); Chunpeng Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/874,609

(22) Filed: Jul. 27, 2022

(65) Prior Publication Data
US 2024/0008318 A1 Jan. 4, 2024

(30) Foreign Application Priority Data
Jun. 30, 2022 (CN) .................... 202210778633.X

(51) Int. Cl.
*H10K 59/124* (2023.01)
*B60R 11/00* (2006.01)
(Continued)

(52) U.S. Cl.
CPC .......... *H10K 59/124* (2023.02); *G02F 1/155* (2013.01); *B60R 2011/0026* (2013.01);
(Continued)

(58) Field of Classification Search
CPC ...... H10K 59/124; H10K 59/12; G02F 1/155; G02F 1/13439; B60R 11/0235
See application file for complete search history.

(56) References Cited

U.S. PATENT DOCUMENTS

| | | | |
|---|---|---|---|
| 6,583,919 B1 * | 6/2003 | Mizutani | ................. B60R 1/088 359/266 |
| 2002/0076616 A1 * | 6/2002 | Lee | ....................... G02F 1/1533 429/300 |

(Continued)

FOREIGN PATENT DOCUMENTS

| | | |
|---|---|---|
| CN | 104021731 A | 9/2014 |
| CN | 110224080 A | 9/2019 |

(Continued)

OTHER PUBLICATIONS

Chinese Office Action issued in corresponding Chinese Patent Application No. 202210778633.X dated Mar. 22, 2023, pp. 1-9, 23pp.

(Continued)

*Primary Examiner* — Lucy P Chien
(74) *Attorney, Agent, or Firm* — The Roy Gross Law Firm, LLC; Roy Gross

(57) ABSTRACT

A display device and a vehicle are disclosed. The display device has a display area including a plurality of display sub areas and a plurality of transparent sub areas. The display device includes a display panel and an electrochromic layer disposed on one side of the display panel. The electrochromic layer includes at least one electrochromic device, the at least one electrochromic device corresponds to at least one of the transparent sub areas, and the at least one electrochromic device transitions between transparent and opaque states.

12 Claims, 5 Drawing Sheets

(51) Int. Cl.
  *B60R 11/02* (2006.01)
  *G02F 1/1343* (2006.01)
  *G02F 1/137* (2006.01)
  *G02F 1/155* (2006.01)
  *H10K 59/12* (2023.01)

(52) U.S. Cl.
  CPC ....... *B60R 11/0235* (2013.01); *G02F 1/13439* (2013.01); *G02F 1/137* (2013.01); *G02F 2201/44* (2013.01); *G02F 2202/28* (2013.01); *H10K 59/12* (2023.02)

(56) References Cited

U.S. PATENT DOCUMENTS

| | | | | |
|---|---|---|---|---|
| 2003/0156314 | A1* | 8/2003 | Shinozaki | ............. G02F 1/1508 359/273 |
| 2005/0270619 | A1* | 12/2005 | Johnson | .................. G02F 1/163 359/265 |
| 2011/0118013 | A1* | 5/2011 | Mattice | ............... G07F 17/3202 463/30 |
| 2021/0291740 | A1* | 9/2021 | Lin | ........................... B60R 1/12 |

FOREIGN PATENT DOCUMENTS

| | | |
|---|---|---|
| CN | 111524929 A | 8/2020 |
| CN | 113655670 A | 11/2021 |
| CN | 113946179 A | 1/2022 |
| CN | 215895194 U | 2/2022 |
| CN | 114519962 A | 5/2022 |
| CN | 216435908 U | 5/2022 |

OTHER PUBLICATIONS

Chinese Office Action issued in corresponding Chinese Patent Application No. 202210778633.X dated Jun. 8, 2023, pp. 1-8, 19pp.

* cited by examiner

DISPLAY DEVICE AND VEHICLE

CROSS REFERENCE TO RELATED APPLICATIONS

This application claims the benefit of priority of Chinese Patent Application No. 202210778633.X, filed Jun. 30, 2022, the contents of which are all incorporated herein by reference in their entirety.

FIELD OF INVENTION

The present disclosure relates to the field of display technologies, and more particularly, to a display device and a vehicle.

BACKGROUND OF INVENTION

Organic light-emitting diode (OLED) display panels or display devices have been widely used in people's lives, such as mobile phones, computers, or other display screens. With development of display technologies, the organic light-emitting diode (OLED) display panels have a wider and wider range of applications, for example, transparent organic light-emitting display panels or transparent organic light-emitting display devices are applied to glass on vehicles.

However, when transparent display devices are applied to the glass of the vehicles in current technology, ambient light that transmits transparent regions of the transparent display devices will affect the display effect, and especially an image-viewing effect is poor when displayed in low grayscales. At a same time, the transparent display devices cannot shield external heat and ultraviolet rays, thereby causing strong light stimulation to passengers.

SUMMARY OF INVENTION

An embodiment of the present disclosure provides a display device and a vehicle, which can solve following problems: when transparent display devices are applied to glass of vehicles in current technology, ambient light that transmits transparent regions of the transparent display devices will affect the display effect, especially an image-viewing effect is poor when displayed in low grayscales, and at a same time, the transparent display devices cannot shield external heat and ultraviolet rays, causing strong light stimulation to passengers.

An embodiment of the present disclosure provides a display device, which has a display area including a plurality of display sub areas and a plurality of transparent sub areas arranged in an array, wherein, the display device includes:
  a display panel including a substrate and a plurality of light-emitting devices disposed on the substrate, wherein, the light-emitting devices are disposed corresponding to the display sub areas; and
  an electrochromic layer disposed on one side of the display panel.

Wherein, the electrochromic layer includes at least one electrochromic device, the at least one electrochromic device corresponds to at least one of the transparent sub areas, and the at least one electrochromic device can transition between transparent and opaque states.

Optionally, in some embodiments of the present disclosure, the electrochromic layer includes a plurality of electrochromic devices, and one electrochromic device corresponds to one transparent sub area.

Optionally, in some embodiments of the present disclosure, the display device further includes a first organic layer covering the electrochromic devices, wherein, the first organic layer includes transmission units disposed corresponding to the display sub areas, and the transmission units are between adjacent electrochromic devices.

Optionally, in some embodiments of the present disclosure, the first organic layer is an optical adhesive layer, the display device further includes a protective coverplate, and the protective coverplate is disposed on the optical adhesive layer.

Optionally, in some embodiments of the present disclosure, the electrochromic layer includes a base substrate, a first electrode layer and a second electrode layer disposed on the base substrate, and an electrochromic material layer disposed between the first electrode layer and the second electrode layer, and the second electrode layer is disposed on one side of the first electrode layer away from the base substrate; and
  the first electrode layer includes first electrodes corresponding to the electrochromic devices by one to one, and the second electrode layer includes second electrodes corresponding to the electrochromic devices by one to one.

Optionally, in some embodiments of the present disclosure, the first electrode layer further includes first connection electrodes connected between adjacent first electrodes, the second electrode layer further includes second connection electrodes connected between adjacent second electrodes, the electrochromic material layer further includes electrochromic material layer connection members connected between adjacent electrochromic devices, and the electrochromic material layer connection members are disposed between the first connection electrodes and the second connection electrodes.

Optionally, in some embodiments of the present disclosure, the display device further includes an encapsulation layer disposed on one side of the light-emitting devices away from the substrate, the base substrate is shared with a layer structure of the display panel, and the base substrate is the encapsulation layer or the substrate.

Optionally, in some embodiments of the present disclosure, the display device further includes an encapsulation layer disposed on one side of the light-emitting devices away from the substrate;
  the electrochromic layer includes a base substrate, a first electrode layer and a second electrode layer disposed on the base substrate, and an electrochromic material layer disposed between the first electrode layer and the second electrode layer, and the second electrode layer is disposed on one side of the first electrode layer away from the base substrate; and the base substrate is attached onto one side of the encapsulation layer away from the substrate, or the base substrate is attached onto one side of the substrate away from the encapsulation layer.

Optionally, in some embodiments of the present disclosure, the electrochromic layer includes an electrochromic device, the electrochromic device corresponds to each of the transparent sub areas and each of the display sub areas, and the electrochromic layer includes a base substrate, a first electrode and a second electrode disposed on the base substrate, and an electrochromic material layer disposed between the first electrode and the second electrode.

Optionally, in some embodiments of the present disclosure, the first electrodes and the second electrodes are transparent electrodes.

Optionally, in some embodiments of the present disclosure, the electrochromic layer further includes an electrolyte layer and an ion storage layer disposed between the first electrodes and the second electrodes, the electrolyte layer is disposed adjacent to the electrochromic material layer, and the ion storage layer is disposed adjacent to the electrolyte layer.

Optionally, in some embodiments of the present disclosure, the display panel further includes an encapsulation layer and transistors and openings disposed between the substrate and the encapsulation layer, the light-emitting devices are disposed on the transistors, the encapsulation layer is disposed on the light-emitting devices, the openings are defined corresponding to the transparent sub areas and penetrate at least inorganic material film layers of the transistors, and a filling material in the openings includes an organic material.

Optionally, in some embodiments of the present disclosure, when a first voltage is applied between the first electrodes and the second electrodes, the electrochromic layer is in an opaque state; and when a second voltage or no voltage is applied between the first electrodes and the second electrodes, the electrochromic layer is in a transparent state, and the second voltage is 0 V.

Correspondingly, an embodiment of the present disclosure further provides a vehicle, which includes the display device mentioned in any one of the above embodiments.

In the embodiments of the present disclosure, the display device is provided, which has the display area including the plurality of display sub areas and the plurality of transparent sub areas arranged in an array, wherein, the display device includes: the display panel including the substrate and the plurality of light-emitting devices disposed on the substrate, wherein, the light-emitting devices are disposed corresponding to the display sub areas; and the electrochromic layer disposed on one side of the display panel. The electrochromic layer includes at least one electrochromic device, the at least one electrochromic device corresponds to at least one of the transparent sub areas, and the at least one electrochromic device can transition between transparent and opaque states. In the present disclosure, the at least one electrochromic device of the electrochromic layer is disposed corresponding to the transparent sub areas. When the display device displays images, the at least one electrochromic device can be transformed into the opaque state to improve a display quality of the images, especially low grayscale displayed images having high quality, and at a same time, to block external heat and ultraviolet rays, thereby preventing strong light stimulation to passengers. When the display device does not display images and the passengers need to observe external environment from the vehicle, the at least one electrochromic device can be transformed into the transparent state, the display device can have a high transmittance effect, and the passengers can observe outside very well.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
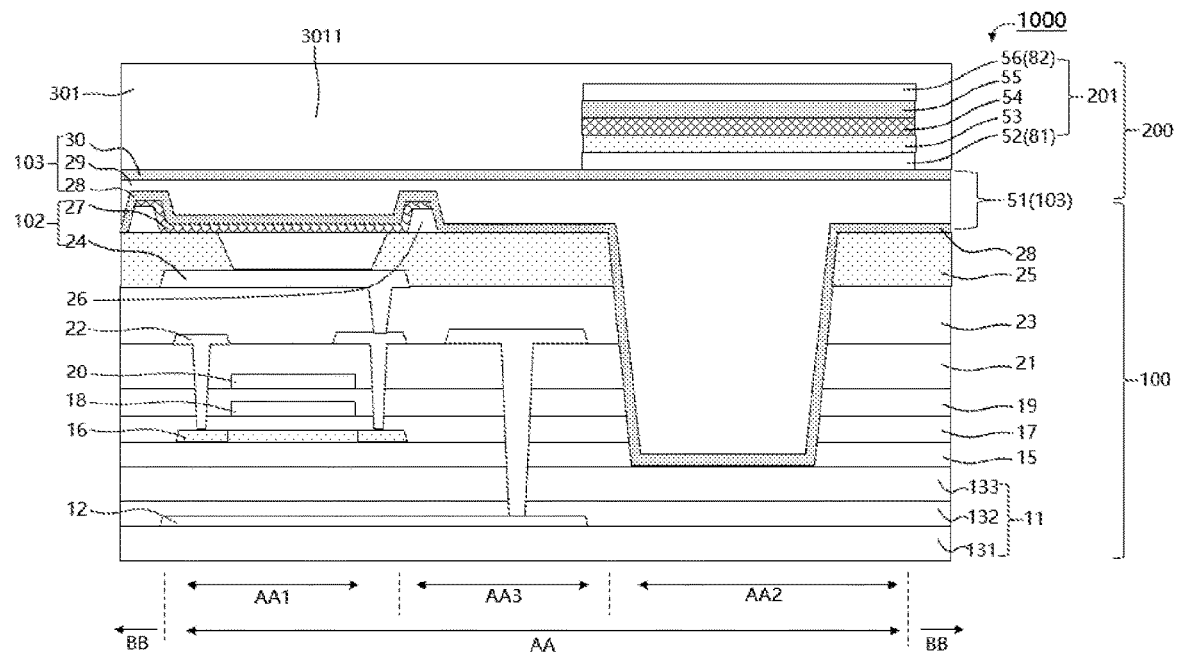
FIG. 1 is a first schematic cross-sectional structural diagram of a display device according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refer to the outline of the device.

An embodiment of the present disclosure provides a display device, which has a display area including a plurality of display sub areas and a plurality of transparent sub areas arranged in an array. The display device includes: a display panel including a substrate and a plurality of light-emitting devices disposed on the substrate, wherein, the light-emitting devices are disposed corresponding to the display sub areas; and an electrochromic layer disposed on one side of the display panel. Wherein, the electrochromic layer includes at least one electrochromic device, an orthographic projection of the at least one electrochromic device on the substrate covers at least one of the transparent sub areas, and the at least one electrochromic device can transition between transparent and opaque states. An embodiment of the present disclosure further provides a vehicle including the display device mentioned above. They will be described in detail in the following. It should be noted that an order of description in the following embodiments is not meant to limit a preferred order of the embodiments.

Embodiment 1

Figure 2:
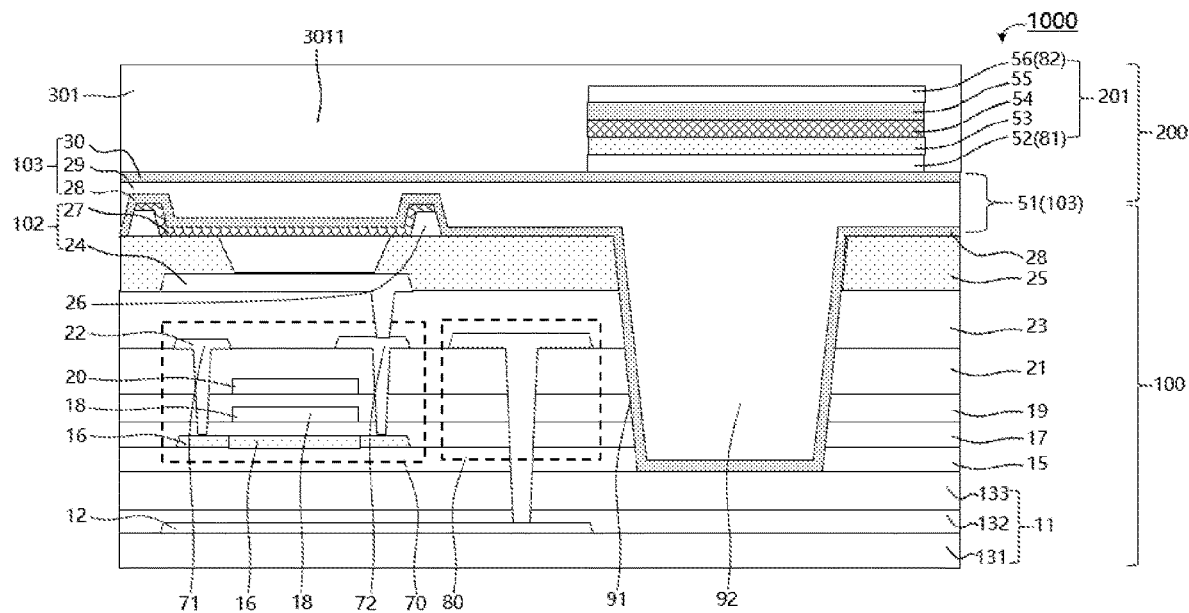
FIG. 2 is a second schematic cross-sectional structural diagram of the display device according to an embodiment of the present disclosure.
Figure 3:
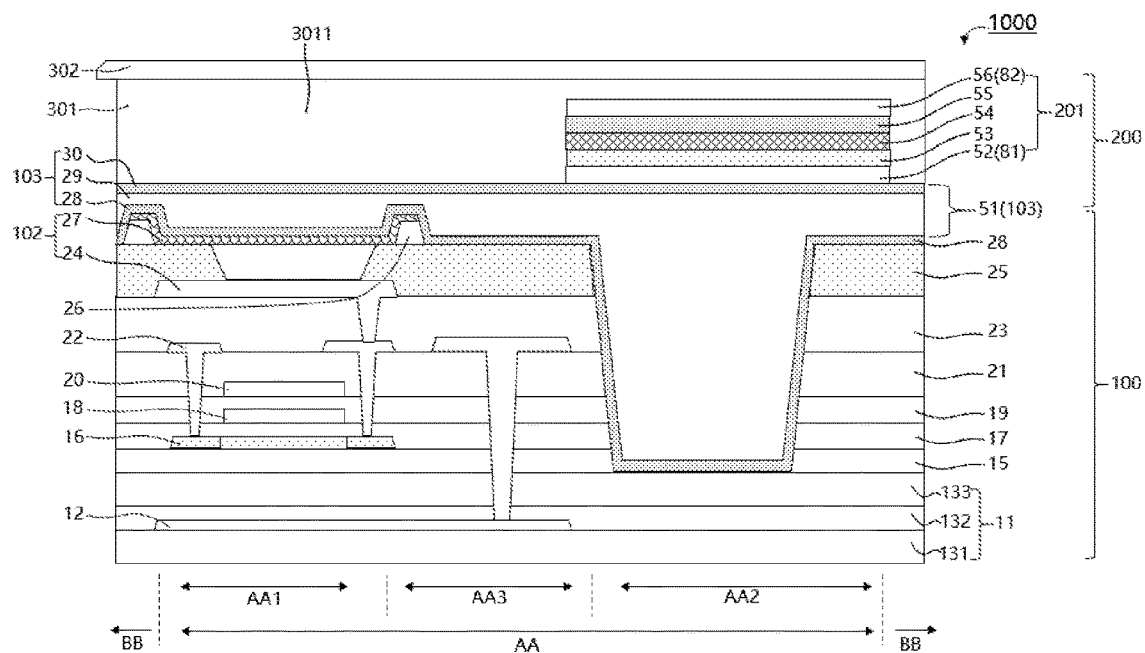
FIG. 3 is a third schematic cross-sectional structural diagram of the display device according to an embodiment of the present disclosure.
Figure 4:
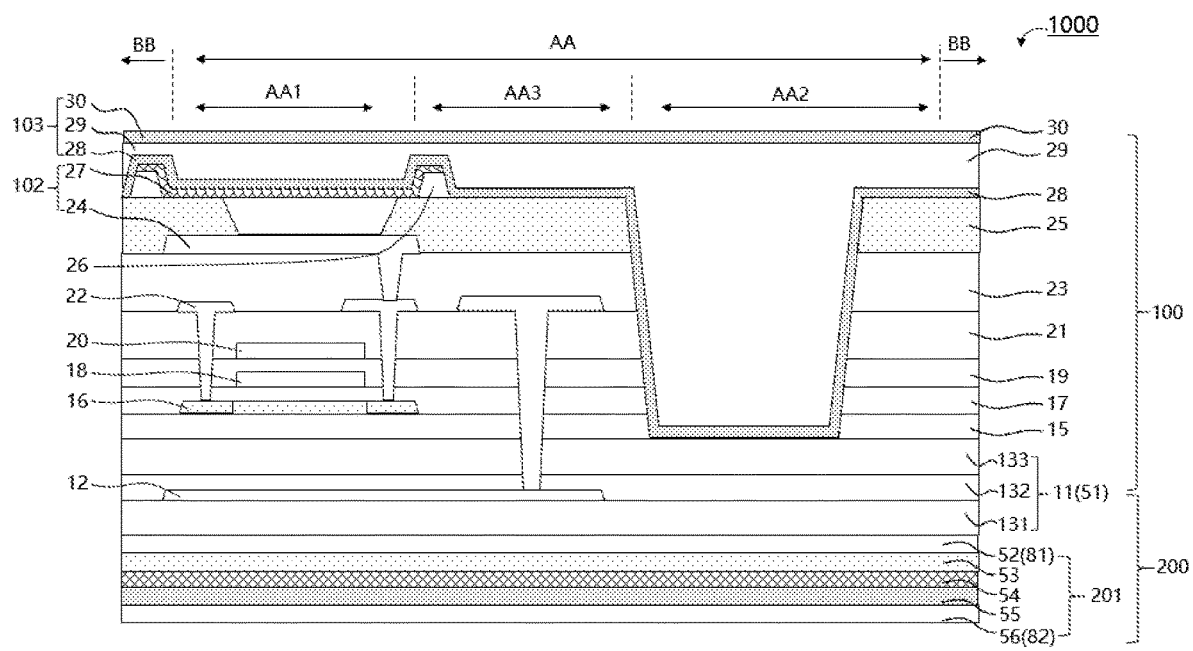
FIG. 4 is a fourth schematic cross-sectional structural diagram of the display device according to an embodiment of the present disclosure.
Figure 5:
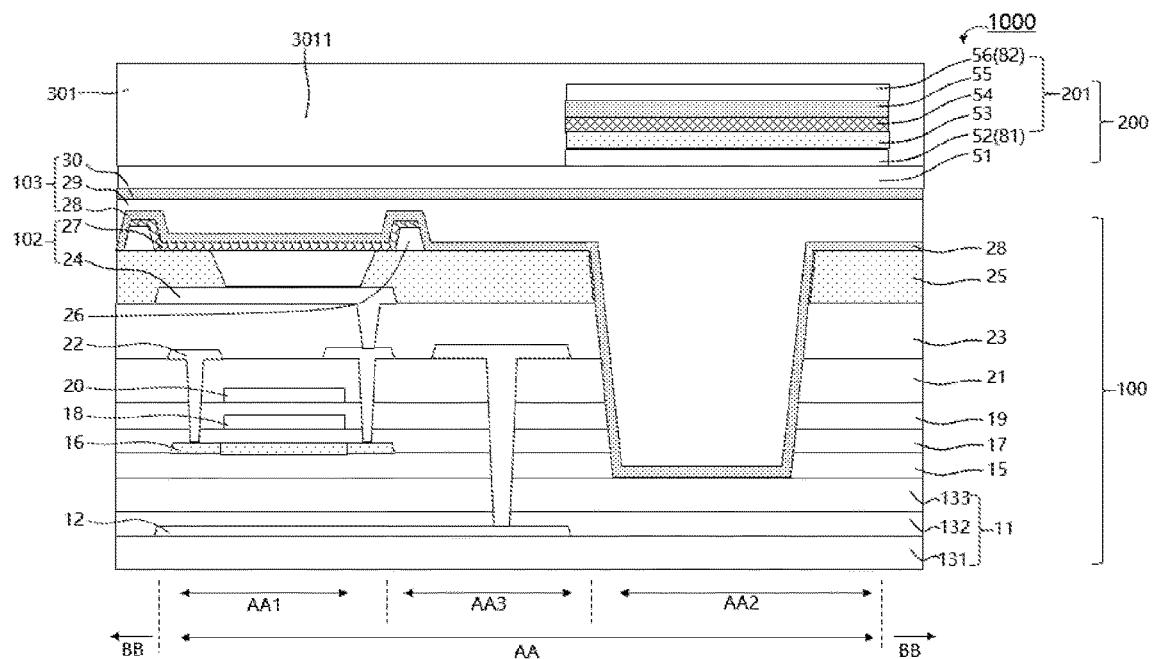
FIG. 5 is a fifth schematic cross-sectional structural diagram of the display device according to an embodiment of the present disclosure.
Figure 6:
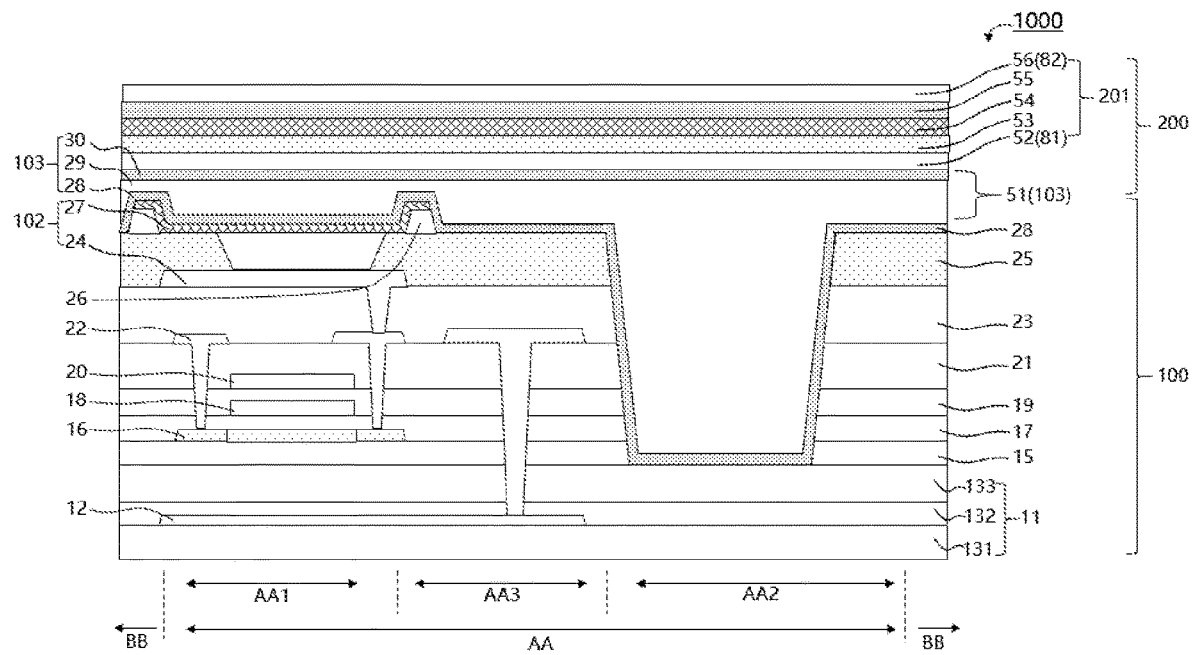
FIG. 6 is a sixth schematic cross-sectional structural diagram of the display device according to an embodiment of the present disclosure.
Figure 7:
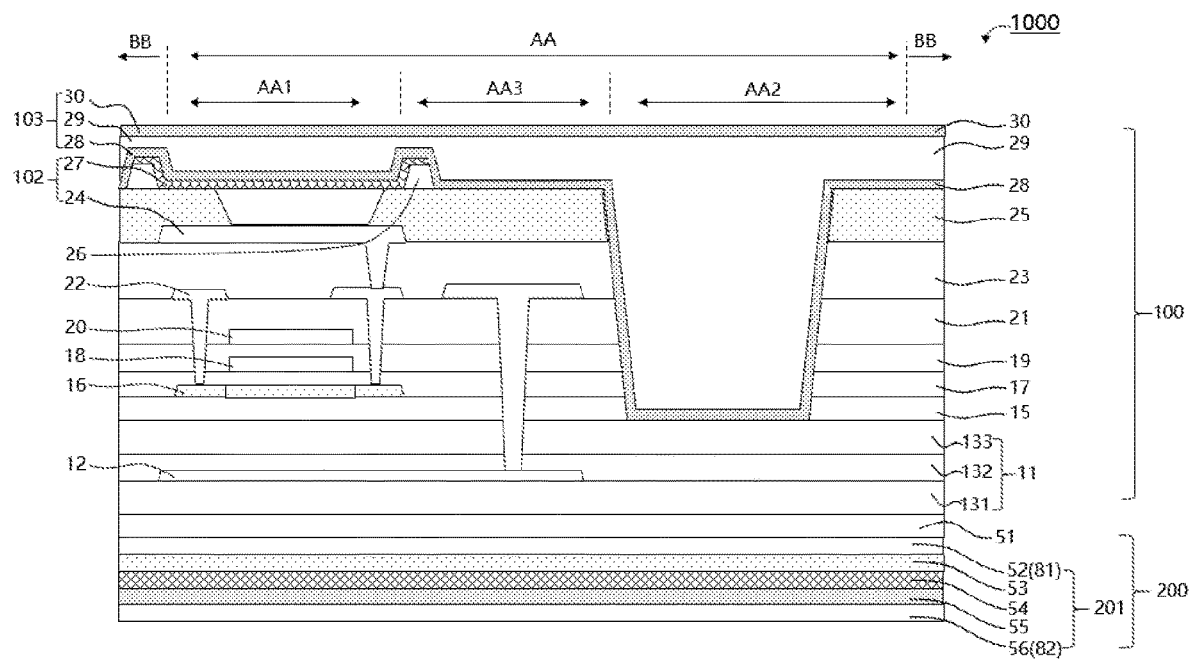
FIG. 7 is a seventh schematic cross-sectional structural diagram of the display device according to an embodiment of the present disclosure.

Referring to FIGS. 1 to 7, FIG. 1 is a first schematic cross-sectional structural diagram of a display device 1000 according to an embodiment of the present disclosure; FIG. 2 is a second schematic cross-sectional structural diagram of the display device 1000 according to an embodiment of the present disclosure; FIG. 3 is a third schematic cross-sectional structural diagram of the display device 1000 according to an embodiment of the present disclosure; FIG. 4 is a fourth schematic cross-sectional structural diagram of the display device 1000 according to an embodiment of the present disclosure; FIG. 5 is a fifth schematic cross-sectional structural diagram of the display device 1000 according to an embodiment of the present disclosure; FIG. 6 is a sixth schematic cross-sectional structural diagram of the display device 1000 according to an embodiment of the present disclosure; and FIG. 7 is a seventh schematic cross-sectional structural diagram of the display device 1000 according to an embodiment of the present disclosure. The structure of FIG. 2 is the same as that of FIG. 1, a difference is that for convenience of labeling, reference numbers of some structures in FIG. 1 are shown in FIG. 2.

This embodiment of the present disclosure provides the display device 1000. The display device 1000 includes a display panel 100 and an electrochromic layer 200. The display device 1000 has a display area AA, which includes a plurality of display sub areas AA1 and a plurality of transparent sub areas AA2 arranged in an array. The display panel 100 includes a substrate 11 and a plurality of light-emitting devices 102 disposed on the substrate 11, and the light-emitting devices 102 are disposed corresponding to the display sub areas AA1. The electrochromic layer 200 is disposed on one side of the display panel 100. Wherein, the electrochromic layer 200 includes at least one electrochromic device 201, the at least one electrochromic device 201 corresponds to at least one of the transparent sub areas AA2, and the at least one electrochromic device 201 can transition between transparent and opaque states.

Specifically, the display device 1000 includes the display area AA, and the display device 1000 may not include a non-display area.

Specifically, in some embodiments, the display device 1000 includes the display area AA and a non-display area BB at least partially surrounding the display area AA. The non-display area BB may also completely surround the display area AA, for example, the non-display area BB surrounds the display area AA from all sides, which is not limited herein.

Specifically, the display panel 100 may be an organic light-emitting diode (OLED) display panel, the display panel 100 may be a liquid crystal display panel, or the display panel 100 may be a micro-light-emitting diode display panel, which is not limited herein. In this embodiment, the display panel 100 being the organic light-emitting diode display panel is taken as an example for description.

Specifically, the display area AA includes the plurality of display sub areas AA1 and the plurality of transparent sub areas AA2 arranged in the array. The display area AA may include a plurality of independent transparent sub areas AA2 disposed in the display area AA in an array, or the transparent sub areas AA2 are disposed between the display sub areas AA1 in an array.

Specifically, the display panel 100 includes the substrate 11 and the plurality of light-emitting devices 102 disposed on the substrate 11. The plurality of light-emitting devices 102 may include a plurality of red light-emitting devices, a plurality of green light-emitting devices, and a plurality of blue light-emitting devices, which is not limited herein. Each of the light-emitting devices 102 may include an anode 24, a cathode 27, and a light-emitting material layer (not shown in the figures) sandwiched between the anode 24 and the cathode 27.

Specifically, the light-emitting devices 102 are disposed corresponding to the display sub areas AA1, the light-emitting devices 102 are disposed in first openings of a pixel definition layer 25, and a size of the display sub areas AA1 may be greater than or equal to a size of the first openings that accommodate the light-emitting devices 102.

Specifically, the display area AA includes the plurality of display sub areas AA1 and the plurality of transparent sub areas AA2, the display sub areas AA1 are used to display images, and the transparent sub areas AA2 are used to provide a channel for ambient light to pass through the display device 1000. The ambient light can pass from one side of the display device 1000 to another side of the display device 1000 through the transparent sub areas AA2.

Specifically, the at least one electrochromic device 201 corresponds to the transparent sub areas AA2. Each electrochromic device 201 includes a first electrode 52 and a second electrode 56, the first electrode 52 is located in the transparent sub areas AA2, or a major part of the first electrode 52 is located in the transparent sub areas AA2, or an orthographic projection of the first electrode 52 on the substrate 11 covers the transparent sub areas AA2.

Specifically, the electrochromic layer 200 is disposed on one side of the display panel 100. As shown in FIG. 1, FIG. 1 shows that the electrochromic layer 200 is disposed on one side of an encapsulation layer 103 of the display panel 100 away from the substrate 11. FIG. 6 shows that the electrochromic layer 200 is disposed on one side of the substrate 11 of the display panel 100 away from the encapsulation layer 103.

Specifically, the electrochromic layer 200 includes a plurality of electrochromic devices 201, the electrochromic devices 201 correspond to the transparent sub areas AA2, and the electrochromic devices 201 can transition between the transparent and opaque states. In the embodiment, the electrochromic devices 201 of the electrochromic layer 200 are disposed corresponding to the transparent sub areas AA2. The function and effect of the display device 1000 are described in detail when the display device 1000 is used as glass on a vehicle. When the display device 1000 displays images, the electrochromic devices 201 can be transformed into the opaque state to improve a display quality of the images, especially low grayscale displayed images having high quality, and at a same time, to block external heat and ultraviolet rays, thereby preventing strong light stimulation to passengers. When the display device 1000 does not display images and the passengers need to observe external environment from the vehicle, the electrochromic devices 201 can be transformed into the transparent state, the display device 1000 can have a high transmittance effect, and the passengers can observe outside very well.

Embodiment 2

This embodiment is the same as or similar to the above-mentioned embodiment, and a difference is that the structure of the display device 1000 is further described.

In some embodiments, as shown in FIGS. 1-3 and 5, the electrochromic layer 200 includes a plurality of electrochromic devices 201, and one electrochromic device 201 corresponds to one transparent sub area AA2.

Specifically, the electrochromic devices 201 correspond to the transparent sub areas AA2. Each electrochromic device 201 includes a first electrode 52 and a second electrode 56, the first electrode 52 is located in the transparent sub areas AA2, or a major part of the first electrode 52 is located in the transparent sub areas AA2, or an orthographic projection of the first electrode 52 on the substrate 11 covers an orthographic projection of the transparent sub areas AA2 on the substrate 11.

Specifically, the electrochromic layer 200 includes the plurality of electrochromic devices 201, and the electrochromic devices 201 are disposed corresponding to the transparent sub areas AA2 in an array. Although only one electrochromic device 201 is illustrated in FIGS. 1-3 and 5, it can be understood that the display device 1000 in FIGS. 1-3 and 5 includes the plurality of electrochromic devices 201 and the plurality of transparent sub areas AA2.

In some embodiments, the display device 1000 further includes a first organic layer 301 covering the electrochromic devices 201, the first organic layer 301 includes transmission units 3011 disposed corresponding to the display sub areas AA2, and the transmission units 3011 are located between adjacent electrochromic devices 201.

Specifically, the electrochromic layer 200 further includes the transmission units 3011, and the transmission units 3011 provide transmission channels for display light emitted in the display sub areas AA1 or from the light-emitting devices 102.

Specifically, the transmission units 3011 correspond to the display sub areas AA1. A range of the transmission units 3011 is greater than or equal to a range of the display sub areas AA1. That is, an orthographic projection of the transmission units 3011 on the substrate 11 covers an orthographic projection of the display sub areas AA1 on the substrate 11, or the orthographic projection of the transmission units 3011 on the substrate 11 overlaps the orthographic projection of the display sub areas AA1 on the substrate 11.

Specifically, the transmission units 3011 being disposed between adjacent electrochromic devices 201 may be the transmission units 3011 and the electrochromic devices 201 being alternately disposed, or the transmission units 3011 and the electrochromic devices 201 being disposed in an array.

Specifically, the first organic layer 301 is a transparent organic material, and the transmission units 3011 can improve the transmittance of the display light emitted by the light-emitting devices 102 corresponding to the display sub areas AA1, so that more display light can be emitted to reach the human eye.

Further, in some embodiments, the display area AA further includes non-transparent sub areas AA3 between the display sub areas AA1 and the transparent sub areas AA2, and an edge of the orthographic projection of the electrochromic devices 201 on the substrate 11 is located within the range of the non-transparent sub areas AA3.

Specifically, the display area AA further includes the non-transparent sub areas AA3 between the display sub areas AA1 and the transparent sub areas AA2, the display panel 100 includes a blocking part 80 (as shown by the dashed box in FIG. 2) composed of structures such as driving circuits, traces, and electrodes, and a partial area of the blocking part 80 is located in the non-transparent sub areas AA3.

Specifically, the edge of the orthographic projection of the electrochromic devices 201 on the substrate 11 being located within the range of the non-transparent sub areas AA3 can allow an entire area of the transparent sub areas AA2 to be covered by the electrochromic devices 201, so that the opaque state and the transparent state in the transparent sub areas AA2 can be better adjusted, thereby preventing light leakage in the opaque state.

It should be noted that in some embodiments, the edge of the orthographic projection of the electrochromic devices 201 on the substrate 11 may overlap an edge of the non-transparent sub areas AA3.

In some embodiments, the first organic layer 301 is an optical adhesive layer, the display device 1000 further includes a protective coverplate 302, and the protective coverplate 302 is disposed on the optical adhesive layer.

Specifically, the first organic layer 301 is the optical adhesive layer, and the optical adhesive layer may include transparent optical adhesive materials such as an optical clear adhesive (OCA) or an optical clear resin (OCR).

Specifically, the protective coverplate 302 (cover glass, CG) is disposed on the optical adhesive layer, that is, the protective coverplate 302 is disposed on one side of the first organic layer 301 away from the substrate 11. The protective coverplate 302 can protect the electrochromic layer 200 from external damages.

Embodiment 3

This embodiment is the same as or similar to the above-mentioned embodiment, and a difference is that the structure of the display device 1000 is further described.

Figure 8:
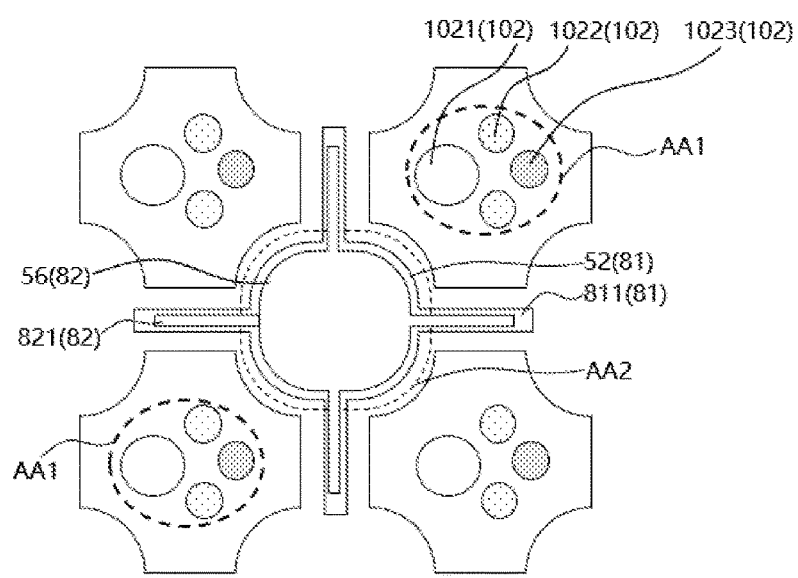
FIG. 8 is a partial schematic top view of a first electrode layer and a second electrode layer of the display device according to an embodiment of the present disclosure.
Figure 9:
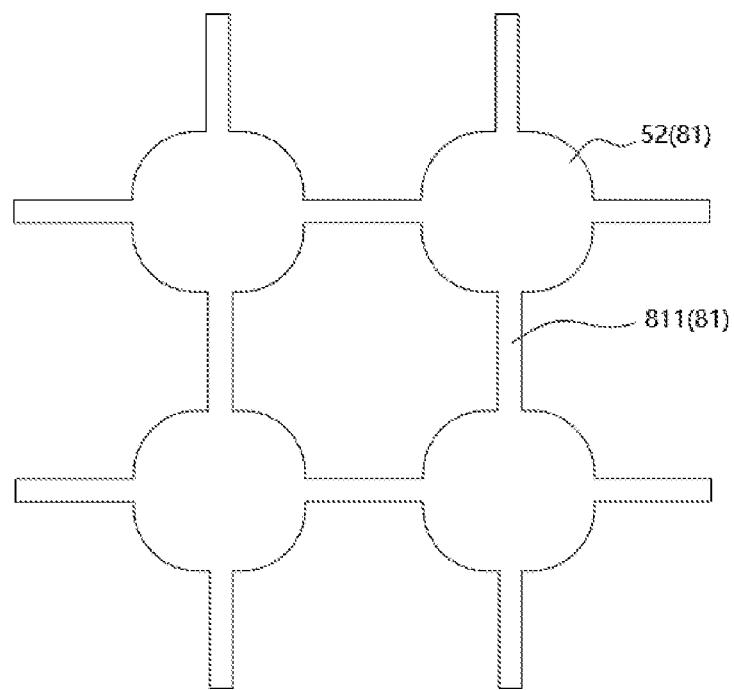
FIG. 9 is a partial schematic top view of the first electrode layer of the display device according to an embodiment of the present disclosure.

Referring to FIGS. 1-3, 5, 8, and 9, FIG. 8 is a partial schematic top view of a first electrode layer and a second electrode layer of the display device 1000 according to an embodiment of the present disclosure, and FIG. 9 is a partial schematic top view of the first electrode layer of the display device 1000 according to an embodiment of the present disclosure. One first electrode is shown in FIG. 8, and a plurality of first electrodes are shown in FIG. 9.

In some embodiments, the electrochromic layer 200 includes a base substrate 51, a first electrode layer 81 and a second electrode layer 82 disposed on the base substrate 51, and an electrochromic material layer 53 disposed between the first electrode layer 81 and the second electrode layer 82, and the second electrode layer 82 is disposed on one side of the first electrode layer 81 away from the base substrate 51. The first electrode layer 81 includes first electrodes 52 corresponding to the electrochromic devices 201 by one to one, and the second electrode layer includes second electrodes 56 corresponding to the electrochromic devices 201 by one to one.

Specifically, the electrochromic function can be realized by disposing the first electrode layer 81 and the second electrode layer 82 disposed on the base substrate 51 and the electrochromic material layer 53 disposed between the first electrode layer 81 and the second electrode layer 82.

In some embodiments, the first electrode layer 81 further includes first connection electrodes 811 connected between adjacent first electrodes 52, the second electrode layer 82 further includes second connection electrodes 821 connected between adjacent second electrodes 56, the electrochromic material layer 53 further includes electrochromic material layer connection members connected between adjacent electrochromic devices 201, and the electrochromic material layer connection members are disposed between the first connection electrodes 811 and the second connection electrodes 821.

Specifically, as shown in FIGS. 8 and 9, after patterning, the first electrode layer 81 includes the plurality of first electrodes 52 and the plurality of first connection electrodes 811, two first electrodes 52 corresponding to two adjacent electrochromic devices 201 can be connected to each other by one first connection electrode 811. Therefore, the plurality of first electrodes 52 corresponding to the plurality of electrochromic devices 201 of the electrochromic layer 200 can be electrically connected together by the plurality of first connection electrodes 811.

Specifically, as shown in FIGS. 8 and 9, after patterning, the second electrode layer 82 includes the plurality of second electrodes 56 and the plurality of second connection electrodes 821, two second electrodes 56 corresponding to two adjacent electrochromic devices 201 can be connected to each other by one second connection electrode 821. Therefore, the plurality of second electrodes 56 corresponding to the plurality of electrochromic devices 201 of the electrochromic layer 200 can be electrically connected together by the plurality of second connection electrodes 821.

Specifically, the electrochromic material layer 53 further includes the electrochromic material layer connection members (not shown in the figures) connected between adjacent electrochromic devices 201, and the electrochromic material layer connection members are disposed between the first connection electrodes 811 and the second connection electrodes 821. The electrochromic material layer connection members are used to carry or support the patterned second electrode layer 82 or the second connection electrodes 821.

Specifically, as shown in FIG. 8, FIG. 8 shows that an orthographic projection of the first electrode 52 on the base substrate 51 covers an orthographic projection of the second electrode 56 on the base substrate 51, or the orthographic projection of the second electrode 56 on the base substrate 51 is located in a partial area of the orthographic projection of the first electrode 52 on the base substrate 51. That is, a width of the second electrodes 56 is less than a width of the first electrodes 52, and a width of the second connection electrodes 821 is less than a width of the first connection electrodes 811. In actual products, the orthographic projection of the first electrodes 52 on the base substrate 51 may completely overlap the orthographic projection of the second electrodes 56 on the base substrate 51, and an orthographic projection of the electrochromic material layer on the base substrate 51 may completely overlap the orthographic projection of the first electrodes 52 and the first connection electrodes 811 on the base substrate 51.

Further, in some embodiments, as shown in FIG. 8, at least three light-emitting devices 102 of different colors are located in one display sub area AA1, and the transparent sub areas AA2 are located between the adjacent display sub areas AA1.

Specifically, as shown in FIG. 8, the example shows one green light-emitting device 1021, two blue light-emitting devices 1022, and one red light-emitting device 1023 located in the one display sub area AA1, but is not limited to this.

In some embodiments, the display device 1000 further includes an encapsulation layer 103 disposed on one side of the light-emitting devices 102 away from the substrate 11, the base substrate 51 is shared with a layer structure of the display panel 100, and the base substrate 51 is the encapsulation layer 103 or the substrate 11.

Specifically, as shown in FIGS. 1 to 4, the base substrate 51 of the electrochromic layer 200 is shared with the layer structure of the display panel 100, which can reduce a thickness of the display device 1000 and improve the transmittance of the display sub areas AA1 and the transparent sub areas AA2. Directly fabricating other components and structures of the electrochromic layer 200 on the layer structure of the display panel 100 can reduce the fabrication process steps and reduce the thickness of the display device 1000.

Specifically, as shown in FIGS. 1 to 4, the base substrate 51 is the encapsulation layer 103 or the substrate 11 of the display panel 100, which can reduce the thickness of the display device 1000 and improve the transmittance of the display sub areas AA1 and the transparent sub areas AA2. At a same time, directly fabricating other components and structures of the electrochromic layer 200 on the encapsulation layer 103 or the substrate 11 can reduce the fabrication process steps.

In some embodiments, the display device 1000 includes the encapsulation layer 103 disposed on the side of the light-emitting devices 102 away from the substrate 11; the electrochromic layer 200 includes the base substrate 51, the first electrode layer 81 and the second electrode layer 82 disposed on the base substrate 51, and the electrochromic material layer 53 disposed between the first electrode layer 81 and the second electrode layer 82, and the second electrode layer 82 is disposed on the side of the first electrode layer 81 away from the base substrate 51; and the base substrate 51 is attached onto one side of the encapsulation layer 103 away from the substrate 11, or the base substrate 51 is attached onto one side of the substrate 11 away from the encapsulation layer 103.

Specifically, as shown in FIGS. 5 and 7, the base substrate 51 is attached onto the side of the encapsulation layer 103 away from the substrate 11 by an adhesive layer (not shown in the figures), or the base substrate 51 is attached onto the side of the substrate 11 away from the encapsulation layer 103 by an adhesive layer (not shown in the figures). The adhesive layer may include OCA, OCR, etc. In these embodiments, the display device 1000 transitioning between the opaque and transparent states may also be realized.

Specifically, the base substrate 51 is attached onto the side of the encapsulation layer 103 away from the substrate 11 by the adhesive layer, or the base substrate 51 is attached onto the side of the substrate 11 away from the encapsulation layer 103 by the adhesive layer, and at this time, the electrochromic layer 200 and the display panel 100 may be manufactured separately, which can save manufacturing time.

Embodiment 4

This embodiment is the same as or similar to Embodiment 2 and Embodiment 3, and a difference is that in this embodiment, the electrochromic layer 200 includes an electrochromic device 201.

In some embodiments, the electrochromic layer 200 includes an electrochromic device 201, the electrochromic device 201 corresponds to each of the transparent sub areas AA2 and each of the display sub areas AA1, and the electrochromic layer 200 includes a base substrate 51, a first electrode 52 and a second electrode 56 disposed on the base substrate 51, and an electrochromic material layer 53 disposed between the first electrode 52 and the second electrode 56.

Specifically, as shown in FIG. 4, 6, or 7, the electrochromic layer 200 includes the electrochromic device 201, the electrochromic device 201 is disposed on the whole surface and corresponds to or covers each of the transparent sub areas AA2 and each of the display sub areas AA1, and the electrochromic layer 200 does not need to be patterned to form a plurality of electrochromic devices 201, thereby reducing a number of manufacturing process steps.

It should be noted that when the electrochromic layer 200 includes one electrochromic device 201, same as the above embodiments, the base substrate 51 may be shared with the layer structure of the display panel 100. Or the base substrate 51 may not be shared with the layer structure of the display panel 100 and is attached onto the display panel 100 by the adhesive layer, and has the same corresponding effects as the above-mentioned embodiments.

Embodiment 5

This embodiment is the same as or similar to the above-mentioned embodiment, and a difference is that the structure of the display device 1000 is further described.

In some embodiments, the first electrodes 52 and the second electrodes 56 are transparent electrodes.

Specifically, the first electrodes 52 and the second electrodes 56 are transparent electrodes, and when the electrochromic devices 201 are in the transparent state, ambient light can pass through.

In some embodiments, the electrochromic layer 200 further includes an electrolyte layer 54 and an ion storage layer 55 disposed between the first electrodes 52 and the second electrodes 56, the electrolyte layer 54 is disposed adjacent to the electrochromic material layer 53, and the ion storage layer 55 is disposed adjacent to the electrolyte layer 54.

Specifically, a layer structure of the electrochromic layer 200 may include the first electrodes 52, the electrochromic material layer 53, the electrolyte layer 54, the ion storage layer 55, and the second electrodes 56 in sequence; the layer structure of the electrochromic layer 200 may also include the first electrodes 52, the ion storage layer 55, the electrolyte layer 54, the electrochromic material layer 53, and the second electrodes 56 in sequence. The layer structure of the electrochromic layer 200 is not limited to this, and may be any one structure in current technology, which is not limited herein, as long as the transition between the opaque state and the transparent state can be realized.

Embodiment 6

This embodiment is the same as or similar to the above-mentioned embodiment, and a difference is that the structure of the display device 1000 is further described.

In some embodiments, the display panel 100 further includes an encapsulation layer 103 and transistors 70 (as shown by the dashed box in FIG. 2) and openings 91 disposed between the substrate 11 and the encapsulation layer 103, the light-emitting devices 102 are disposed on the transistors 70, the encapsulation layer 103 is disposed on the light-emitting devices 102, the openings 91 are defined corresponding to the transparent sub areas AA2 and penetrate at least inorganic material film layers of the transistors 70, and a filling material 92 in the openings 91 includes an organic material.

Specifically, the display panel 100 includes the substrate 11, the transistors 70 disposed on the substrate 11, the light-emitting devices 102 disposed on the transistors 70, and the encapsulation layer 103 disposed on the light-emitting devices 102. Each of the transistors 70 includes a semiconductor layer 16, a gate insulating layer 17, a gate electrode 18, an interlayer insulating layer 21, a source electrode 71, and a drain electrode 72. The openings 91 penetrate at least the inorganic material film layers of the transistors 70, that is, the openings 91 penetrate at least the gate insulating layer 17 and the interlayer insulating layer 21.

Specifically, when the display panel 100 further includes other inorganic material film layers disposed on the substrate 11, or when the transistors 70 further include other inorganic material film layers, the openings 91 may also penetrate other inorganic material film layers.

Specifically, as shown in FIGS. 1 and 2, a structure of the display panel 100 is taken as an example. The layer structure of the display panel includes the substrate 11, a buffer layer 15, the semiconductor layer 16, the gate insulating layer 17, the gate electrode 18, a first insulating layer 19, a first metal layer 20, the interlayer insulating layer 21, a second metal layer 22, a planarization layer 23, the anode 24, the pixel definition layer 25, a support column 26, the cathode 27, and the encapsulation layer 103 in sequence. Wherein, the encapsulation layer 103 includes a first inorganic encapsulation layer 28, a first organic encapsulation layer 29, and a second inorganic encapsulation layer 30. The encapsulation layer 103 is a multi-layer laminated structure of inorganic layers and organic layers. Wherein, the second metal layer 22 includes the source electrode 71 and the drain electrode 72.

Specifically, as shown in FIGS. 1 and 2, as an example, the openings 91 penetrate the buffer layer 15, the gate insulating layer 17, the first insulating layer 19, the interlayer insulating layer 21, the planarization layer 23, the pixel definition layer 25, and the cathode 27.

Specifically, the openings 91 are defined corresponding to the transparent sub areas AA2, that is, the openings 91 are located in the transparent sub areas AA2.

Specifically, the filling material 92 in the openings 91 includes an organic material, and the organic material has a high transmittance, specifically, a transparent organic material, which can improve the transmittance of the transparent sub areas.

Further, in some embodiments, the encapsulation layer 103 is filled in the openings 91.

Specifically, by filling the encapsulation layer 103 in the openings 91, water vapor and oxygen can be prevented from entering the display panel 100 through the openings 91, thereby improving the service life and reliability of the display panel 100.

Embodiment 7

This embodiment is the same as or similar to the above-mentioned embodiment, and a difference is that the working process of the display device 1000 in any one of the above embodiments is described.

In some embodiments, when a first voltage is applied between the first electrodes 52 and the second electrodes 56, the electrochromic layer 200 is in the opaque state. when a second voltage or no voltage is applied between the first electrodes 52 and the second electrodes 56, the electrochromic layer 200 is in the transparent state, and the second voltage is 0 V.

Specifically, a material of the electrochromic material layer 53 may include inorganic electrochromic materials or/and organic electrochromic materials. The inorganic electrochromic materials may include transition metal oxides, such as iridium oxide, tungsten oxide, cobalt oxide, etc., or Prussian blue materials (Prussian blue, Prussian black, Prussian green, etc.). The organic electrochromic materials may include viologen, polypyrrole, polyaniline, polythiophene, etc.

Specifically, a material of the electrolyte layer 54 may include a solution containing lithium perchlorate, sodium perchlorate, etc., and may also include solid electrolyte materials, such as polyethylene oxide (PEO), polypropylene oxide, polyacrylic acid, polyamide, polyester, or polyethyleneamine.

Specifically, a material of the ion storage layer 55 may include one or a combination of at least two of Prussian blue, Prussian blue derivatives, FeNiHCF, FeHCF, or NiHCF.

Specifically, the first electrodes 52 and the second electrodes 56 are transparent electrodes, and a material of the first electrodes 52 and the second electrodes 56 may be one or a combination of at least two of indium tin oxide (ITO), FTO (fluorine-doped $SnO_2$ transparent conductive glass), tin oxide ($SnO_2$), or AZO (aluminum-doped zinc oxide (ZnO) transparent conductive glass).

Specifically, a $WO_3$ (tungsten trioxide) material as the electrochromic material layer 53 is taken as an example to illustrate the working principle of the electrochromic devices 201. When the first voltage is applied between the first electrodes 52 and the second electrodes 56, electrons and positive ions are simultaneously injected into WO3 from both sides under the action of the electric field between the first electrodes 52 and the second electrodes 56. The electrons are captured by W (tungsten) atoms to form a localized state, and metal ions M+ (represented by M+) reside in this region to form a dark blue tungsten bronze compound ($MxWO_3$). There are W ions of different valence states in $MxWO_3$, and transitions of the electrons between adjacent W atoms of different valence states cause a color of a $WO_3$ film to change from colorless to blue, thereby making the electrochromic devices 201 in the opaque state. When the second voltage is applied between the first electrodes 52 and the second electrodes 56 or no voltage is applied, the second voltage is 0 V, there is no electric field between the first electrodes 52 and the second electrodes 56, and the color of the electrochromic material layer 53 does not change, so that the electrochromic devices 201 are in the transparent state.

Specifically, it should be noted that when the materials included in the electrochromic layer 200 are different, for example, when the material of the electrochromic material layer 53 is different, when the first voltage is applied between the first electrodes 52 and the second electrodes 56, the electrochromic layer 200 may be in the transparent state; and when the second voltage or no voltage is applied between the first electrodes 52 and the second electrodes 56, the electrochromic layer 200 may be in the opaque state, and the second voltage is 0 V.

Specifically, it should be noted that the structure of the electrochromic layer 200 may be any one in current technology, and the materials included in the electrochromic layer 200 may be any one in the current technology, which are not repeated herein.

It should be noted that the substrate 11 may be a flexible substrate, and when the substrate 11 is a flexible substrate, the substrate 11 may include a first sub substrate 131, a second sub substrate 133, and a second insulating layer 132 sandwiched between the first sub substrate 131 and the second sub substrate 133; or the substrate 11 may include a light-shielding layer 12 disposed between the first sub substrate 131 and the second sub substrate 133, which is not limited herein.

It should be noted that the first connection electrodes 811 or/and the second connection electrodes 821 may extend to the non-display area BB, and may be electrically connected to a driving chip by soldering silver paste or bonding in the non-display area BB.

Embodiment 8

An embodiment of the present disclosure further provides a vehicle 2000, which includes the display device 1000 mentioned in any one of the above embodiments.

Figure 10:
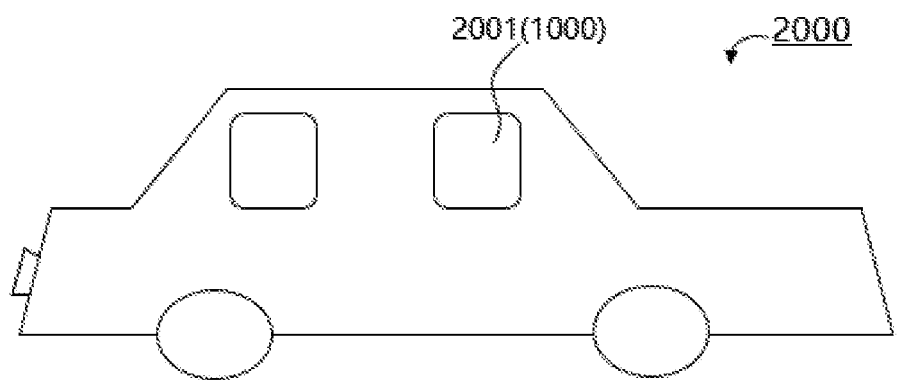
FIG. 10 is a schematic diagram of a vehicle according to an embodiment of the present disclosure.

Referring to FIG. 10, FIG. 10 is a schematic diagram of the vehicle according to an embodiment of the present disclosure.

Specifically, as shown in FIG. 10, the vehicle 2000 includes glass 2001, such as car window glass, the display device 1000 may be used on the glass 2001, or the display device 1000 may be directly used as the glass 2001. Therefore, the vehicle 2000 can have the beneficial effects described in the display device 1000 in the above embodiments, which are not repeated herein.

The display device and the vehicle provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display device, having a display area comprising a plurality of display sub areas and a plurality of transparent sub areas arranged in an array, wherein the display device comprises:
    a display panel comprising a substrate and a plurality of light-emitting devices disposed on the substrate, wherein the light-emitting devices are disposed corresponding to the display sub areas; and
    an electrochromic layer disposed on one side of the display panel;
    wherein the electrochromic layer comprises a plurality of electrochromic devices corresponding to the transparent sub areas and arranged in a second array, and each of the electrochromic devices transitions between transparent and opaque states;
    wherein the array comprises a plurality of array units, each of the array units comprises two of the display sub areas arranged along a first diagonal line and two of the transparent sub areas arranged along a second diagonal line intersecting the first diagonal line;
    wherein each of the array units corresponds to two of the electrochromic devices arranged along the second diagonal line of the array unit and corresponding to the two of the transparent sub areas.

2. The display device according to claim 1, further comprising a first organic layer covering the electrochromic devices, wherein the first organic layer comprises transmission units disposed corresponding to the display sub areas, and the transmission units are between adjacent electrochromic devices.

3. The display device according to claim 2, wherein the first organic layer is an optical adhesive layer, the display device further comprises a protective coverplate, and the protective coverplate is disposed on the optical adhesive layer.

4. The display device according to claim 2, wherein the electrochromic layer comprises a base substrate, a first electrode layer and a second electrode layer disposed on the base substrate, and an electrochromic material layer disposed between the first electrode layer and the second electrode layer, and the second electrode layer is disposed on one side of the first electrode layer away from the base substrate; and the first electrode layer comprises first electrodes corresponding to the electrochromic devices by one to one, and the second electrode layer comprises second electrodes corresponding to the electrochromic devices by one to one.

5. The display device according to claim 4, wherein the first electrode layer further comprises first connection electrodes connected between adjacent first electrodes, the second electrode layer further comprises second connection electrodes connected between adjacent second electrodes, the electrochromic material layer further comprises electrochromic material layer connection members connected between adjacent electrochromic devices, and the electrochromic material layer connection members are disposed between the first connection electrodes and the second connection electrodes.

6. The display device according to claim 4, further comprising an encapsulation layer disposed on one side of the light-emitting devices away from the substrate, wherein the base substrate is shared with a layer structure of the display panel, and the base substrate is the encapsulation layer or the substrate.

7. The display device according to claim 2, further comprising an encapsulation layer disposed on one side of the light-emitting devices away from the substrate;

wherein the electrochromic layer comprises a base substrate, a first electrode layer and a second electrode layer disposed on the base substrate, and an electrochromic material layer disposed between the first electrode layer and the second electrode layer, and the second electrode layer is disposed on one side of the first electrode layer away from the base substrate; and the base substrate is attached onto one side of the encapsulation layer away from the substrate, or the base substrate is attached onto one side of the substrate away from the encapsulation layer.

8. The display device according to claim 4, wherein the first electrodes and the second electrodes are transparent electrodes.

9. The display device according to claim 8, wherein the electrochromic layer further comprises an electrolyte layer and an ion storage layer disposed between the first electrodes and the second electrodes, the electrolyte layer is disposed adjacent to the electrochromic material layer, and the ion storage layer is disposed adjacent to the electrolyte layer.

10. The display device according to claim 1, wherein the display panel further comprises an encapsulation layer and transistors and openings disposed between the substrate and the encapsulation layer, the light-emitting devices are disposed on the transistors, the encapsulation layer is disposed on the light-emitting devices, the openings are defined corresponding to the transparent sub areas and penetrate at least inorganic material film layers of the transistors, and a filling material in the openings comprises an organic material.

11. The display device according to claim 4, wherein when a first voltage is applied between the first electrodes and the second electrodes, the electrochromic layer is in an opaque state; and when a second voltage or no voltage is applied between the first electrodes and the second electrodes, the electrochromic layer is in a transparent state, and the second voltage is 0 V.

12. A vehicle, comprising the display device according to claim 1.

\* \* \* \* \*